United States Patent
Ochi (10) Patent No.: US 10,057,985 B2
(45) Date of Patent: *Aug. 21, 2018

(54) PRINTED SUBSTRATE AND ELECTRONIC DEVICE

(71) Applicant: DENSO CORPORATION, Kariya, Aichi-pref. (JP)

(72) Inventor: Kenji Ochi, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/617,082

(22) Filed: Jun. 8, 2017

(65) Prior Publication Data

US 2017/0359895 A1 Dec. 14, 2017

(30) Foreign Application Priority Data

Jun. 10, 2016 (JP) .................................. 2016-116412
May 25, 2017 (JP) .................................. 2017-103931

(51) Int. Cl.
| | |
|---|---|
| H05K 1/09 | (2006.01) |
| H05K 1/11 | (2006.01) |
| H05K 1/18 | (2006.01) |
| H05K 5/00 | (2006.01) |

(52) U.S. Cl.
CPC ............. *H05K 1/092* (2013.01); *H05K 1/111* (2013.01); *H05K 1/181* (2013.01); *H05K 5/0069* (2013.01); *H05K 2201/10522* (2013.01); *H05K 2201/10628* (2013.01); *H05K 2201/10636* (2013.01)

(58) Field of Classification Search
CPC ........ H05K 3/306; H05K 3/308; H05K 1/092; H05K 1/111; H05K 1/181; H05K 5/0069; H05K 2201/10522; H05K 2201/10628; H05K 2201/10636; H01R 12/585

See application file for complete search history.

(56) References Cited

U.S. PATENT DOCUMENTS

| | | | | |
|---|---|---|---|---|
| 2009/0250256 | A1* | 10/2009 | Ouchi | H01R 13/2485 174/260 |
| 2012/0125668 | A1* | 5/2012 | Chang | H01L 21/4853 174/257 |
| 2013/0004856 | A1* | 1/2013 | Hosoe | H01G 9/016 429/245 |
| 2015/0289382 | A1* | 10/2015 | Takeuchi | H05K 1/115 174/266 |

(Continued)

FOREIGN PATENT DOCUMENTS

| | | |
|---|---|---|
| JP | 2000-273684 A | 10/2000 |
| JP | 2007-059451 A | 3/2007 |

OTHER PUBLICATIONS

U.S. Appl. No. 15/617,083, filed Jun. 8, 2017, Ochi.

*Primary Examiner* — Steven T Sawyer
(74) *Attorney, Agent, or Firm* — Posz Law Group, PLC (57) ABSTRACT

A printed substrate includes a land that is to be soldered. The land includes a plating film that defines a surface of the land. The plating film includes a metal as a main constituent and a pi-acceptor molecule that is dispersed in the plating film. The pi-acceptor molecule has pi-acceptability and causes ligand field splitting equal to or greater than that of 2,2'-bipyridyl in spectrochemical series. A content of the pi-acceptor molecule in the plating film is equal to or greater than 0.1 weight percent, in terms of carbon atoms, with respect to the metal of the plating film.

13 Claims, 5 Drawing Sheets

(56) References Cited

U.S. PATENT DOCUMENTS

2015/0382445 A1* 12/2015 Choi ..................... H05K 1/115
               174/251
2016/0201211 A1  7/2016 Ochi et al.
2017/0012377 A1  1/2017 Ochi

* cited by examiner

PRINTED SUBSTRATE AND ELECTRONIC DEVICE

CROSS REFERENCE TO RELATED APPLICATIONS

This application is based on Japanese Patent Application No. 2016-116412 filed on Jun. 10, 2016 and Japanese Patent Application No. 2017-103931 filed on May 25, 2017, the disclosures of which are incorporated herein by reference.

TECHNICAL FIELD

The present disclosure relates to a printed substrate including a land that is to be soldered, and an electronic device.

BACKGROUND

Conventionally, as described in JP 2007-59451, it has been known to restrict oxidation of a land of a printed substrate by applying a pre-flux to a surface of the land.

SUMMARY

The pre-flux tends to have short life-span. When the printed substrate to which the pre-flux is applied is stored in air, the pre-flux is depleted in a short span. In this case, soldering failure is likely to occur in forming an electronic device by soldering the printed substrate.

It is an object of the present disclosure to provide a printed substrate and an electronic device capable of restricting oxidation of a land without a pre-flux.

According to a first aspect of the present disclosure, a printed substrate includes a land that is to be soldered. The land includes a plating film that defines a surface of the land. The plating film includes a metal as a main constituent and a pi-acceptor molecule that is dispersed in the plating film. The pi-acceptor molecule has pi-acceptability and causes ligand field splitting equal to or greater than that of 2,2'-bipyridyl in spectrochemical series. A content of the pi-acceptor molecule in the plating film is equal to or greater than 0.1 weight percent, in terms of carbon atoms, with respect to the metal of the plating film.

Hereinafter, electrons localized in a metal at the surface of the land are referred to as dangling bonds. According to a first aspect of the present disclosure, the pi-acceptor molecule forms a pi-backbonding with a metal having the dangling bonds. The dangling bonds at the surface of the land are reduced or removed. As a result, oxidation of the land is restricted.

Also, the oxidation of the land is restricted without employing a pre-flux. Even though the printed substrate is stored in air, the oxidation of the land is restricted for a long period of time.

According to a second aspect of the present disclosure, an electronic device includes an electrical component and a printed substrate that has a land electrically connected to the electrical component through a solder. The land includes a plating film that defines a surface of the land. The plating film includes a metal as a main constituent and a pi-acceptor molecule that is dispersed in the plating film. The pi-acceptor molecule has pi-acceptability and causes ligand field splitting equal to or greater than that of 2,2'-bipyridyl in spectrochemical series. A content of the pi-acceptor molecule in the plating film is equal to or greater than 0.1 weight percent, in terms of carbon atoms, with respect to the metal of the plating film.

According to the second aspect of the present disclosure, effects similar to the printed substrate of the first aspect of the present disclosure are achieved.

BRIEF DESCRIPTION OF THE DRAWINGS

The above and other objects, features and advantages of the present disclosure will become more apparent from the following detailed description made with reference to the accompanying drawings, in which like parts are designated by like reference numbers and in which.

DETAILED DESCRIPTION

Embodiments of the present disclosure will be described with reference to the drawings. In the following embodiments, portions functionally and/or structurally corresponding to each other will be designated with the same symbols. Hereinafter, a thickness direction of a printed substrate is referred to as Z direction. A direction orthogonal to the Z direction is referred to as X direction. The X direction corresponds to a depth direction of an opening of an enclosure. A direction orthogonal to the Z direction and the X direction is referred to as Y direction. Unless otherwise noted, a plane shape extends along XY plane.

(First Embodiment)

Schematic structures of a printed substrate and an electronic device including the printed substrate according to the present embodiment will be described with reference to FIG. 1.

Figure 1:
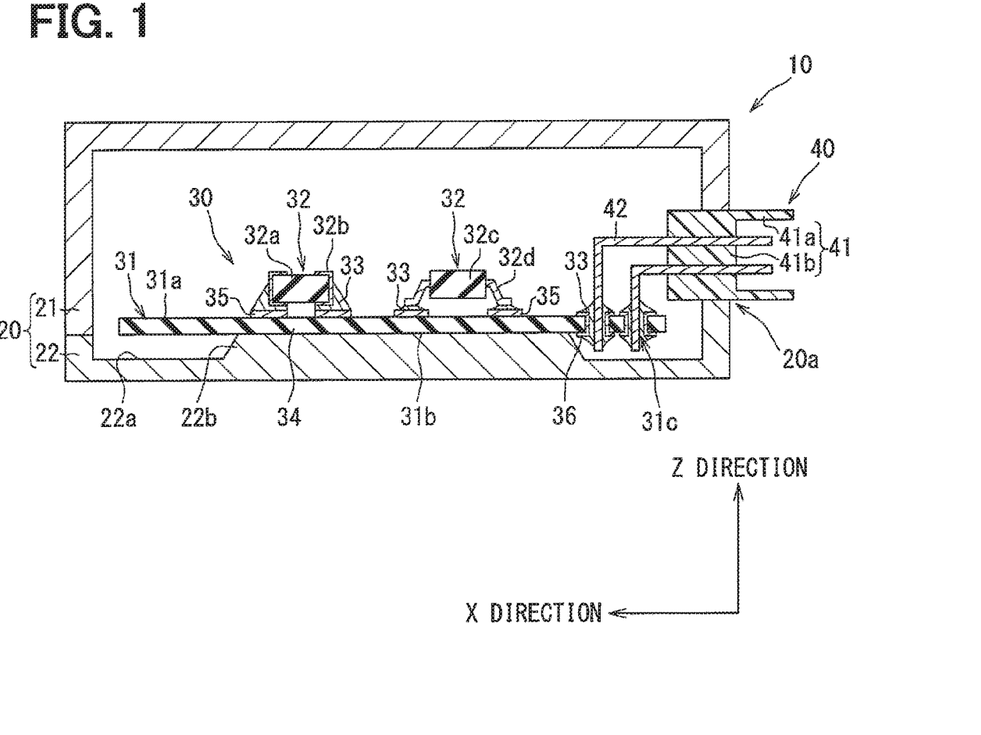
FIG. 1 is a cross-sectional view illustrating schematic structures of a printed substrate and an electronic device according to a first embodiment.

For example, an electronic device 10 shown in FIG. 1 is mounted to a vehicle. The electronic device 10 is an electronic control unit (ECU) controlling a vehicle. For example, the electronic device 10 is an engine ECU controlling an engine mounted to a vehicle.

The electronic device 10 includes an enclosure 20, a circuit board 30 and a connector 40.

The enclosure 20 accommodates the circuit board 30 to protect the circuit board 30. For example, the enclosure 20 is made of metal such as aluminum in order to improve radiation performance of heat generated in the circuit board 30. For example, the circuit board 30 is made of resin in order to reduce a weight of the electronic device 10.

In the present embodiment, the enclosure 20 includes two members divided in the Z direction, that is, a case 21 and a cover 22. The case 21 and the cover 22 are made of a material including aluminum. The enclosure 20 is provided by assembling the case 21 and the cover 22 in the Z direction. A method for assembling the case 21 and the cover 22 is not especially limited. Well-known method such as a screw fixing may be adopted.

The case 21 has a box shape and a top surface of the case 21 has an opening. A bottom surface of the case 21 has almost rectangular shape corresponding to the circuit board 30 that has a flat and almost rectangular shape. The case 21 has four side surfaces and one of the side surfaces has an opening. The opening of the one of the side surfaces and the opening of the top surface of the case 21 communicate with each other.

The cover 22 defines an internal space of the enclosure 20 with the case 21. When the case 21 and the cover 22 are assembled, the cover 22 occludes the opening of the top surface of the case 21 and provides an opening 20a. The opening 20a is provided by the opening of the one of the side surfaces of the case 21 when the opening of the top surface of the case 21 is occluded by the cover 22.

The circuit board 30 includes a printed substrate 31 and electronic components 32 mounted on the printed substrate 31. The electronic components 32 are electrically connected to the printed substrate 31 through solders 33. The circuit board 30 is accommodated in the internal space of the enclosure 20. The printed substrate 31 has a front surface 31a and a rear surface 31b. The rear surface 31b is opposite to the front surface 31a in the Z direction. A thickness direction of the printed substrate 31 corresponds to the Z direction. The printed substrate 31 has a flat and almost rectangular shape. The printed substrate 31, i.e., the circuit board 30 is fixed to the enclosure 20 by well-known method such as a screw fixing, an adhesion and the like. In the present embodiment, the cover 22 has a shallow box shape. The cover 22 has a support 22b that protrudes from an inner bottom surface 22a toward the printed substrate 31. The rear surface 31b of the printed substrate 31 is supported by the support 22b and the printed substrate 31 is fixed to the cover 22, i.e., the enclosure 20.

The printed substrate 31 includes an insulation base 34 and wirings arranged on the insulation base 34. The insulation base 34 is made of an electrical insulation material such as resin. The wirings and the electronic components 32 form circuits. In FIG. 1, only lands 35 and 36 of the wirings of the printed substrate 31 are illustrated. The lands 35 and 36 are electrodes for external connections. That is, the lands 35 and 36 are portions of the wirings that are to be soldered.

The lands 35 are formed on at least one of the front surface 31a and the rear surface 31b of the printed substrate 31. The electronic components 32 and the connector 40 are electrically connected to the lands 35 through the solders 33.

In the present embodiment, as shown in FIG. 1, the lands 35 are formed at the front surface 31a of the printed substrate 31. The electronic components 32, which are surface-mount-type components, are electrically connected to the lands 35 through the solders 33. One of the electronic components 32 includes a body 32a and an electrode 32b. The body 32a is located above the front surface 31a and the electrode 32b is formed at a surface of the body 32a. The electrode 32b is connected to the corresponding land 35 through the solder 33. The other one of the electronic components 32 includes a body 32c and a lead 32d. The body 32c is located above the front surface 31a and sealed by a molding resin. The lead 32d protrudes from the molding resin of the body 32c to outside. The lead 32d is connected to the land 35 through the solder 33.

The printed substrate 31 has through holes 31c that penetrate the printed substrate 31 from the front surface 31a to the rear surface 31b. Each lands 36 is formed at a wall surface of the through hole 31c. The land 36 may be referred to as a through hole land. In the present embodiment, the land 36 is integrally formed at the wall surface of the through hole 31c and portions of the front surface 31a and the rear surface 31b around the through hole 31c. Terminals 42 of the connector 40, which will be described later, are connected to the lands 36 through the solders 33. The electronic components 32 and the connector 40 correspond to electrical components.

The connector 40 is disposed at one end side of the printed substrate 31 in the X direction. The connector 40 is inserted and mounted to the printed substrate 31. A part of the connector 40 is exposed to outside through the opening 20a of the enclosure 20 and the remaining part of the connector 40 is accommodated in the internal space of the enclosure 20. The connector 40 includes a housing 41 and terminals 42.

The housing 41 is made of resin. The housing 41 includes a tube part 41a and an occluding part 41b. The tube part 41a has a tubular shape. The tube part 41a has an axis along the X direction. The occluding part 41b is communicated with the tube part 41a and occludes the tube part 41a. The occluding part 41b holds the terminals 42. In the present embodiment, the occluding part 41b occludes one end of the tube part 41a. Accordingly, the housing 41 has a tube shape with a bottom wall.

The terminals 42 are made of conductive materials. The terminals 42 electrically connect the circuits formed in the circuit board 30 to external devices. The terminals 42 are held by the occluding part 41b, for example, by a press-fitting or an insert molding. Although not illustrated, the terminals 42 are arranged in the Y direction, which is a width direction of the housing 41. In the present embodiment, since a large number of terminals 42 are provided, the terminals 42 are arranged in columns in the Z direction. Each of the terminals 42 has an almost L shape. Each of the terminals 42 is inserted into the through hole 31c. Each of the terminals 43 is connected to the land 36 while penetrating the through hole 31c.

The above described electronic device 10 may be applied to a waterproof structure and a non-waterproof structure.

Figure 2:
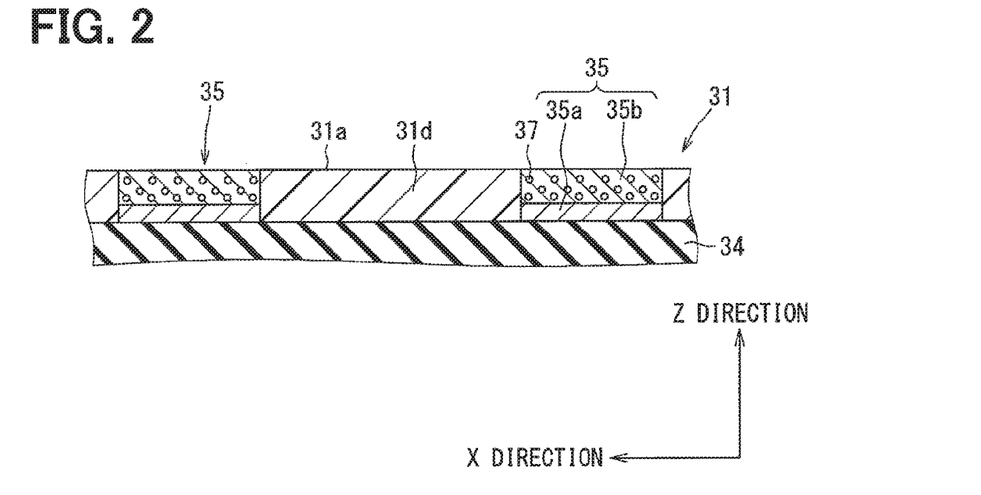
FIG. 2 is a cross-sectional view illustrating a circumference of a land of the printed substrate on which an electronic component is mounted.
Figure 3:
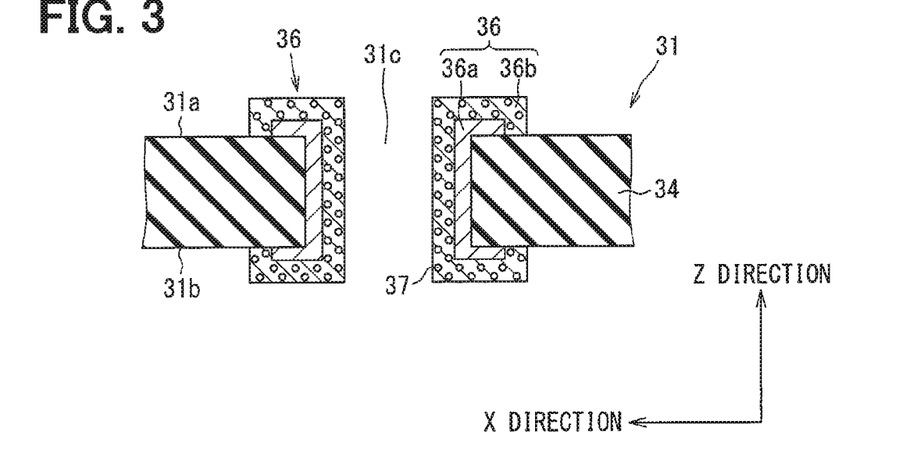
FIG. 3 is a cross-sectional view illustrating a circumference of a land of the printed substrate that is formed at a wall surface of a through hole.

Detailed structures of the lands 35 and 36 will be described with reference to FIG. 2 and FIG. 3. FIG. 2 and FIG. 3 schematically illustrate a dispersion of a pi-acceptor molecule 37 (i.e., π-acceptor molecule 37), which will be described later. In FIG. 3, illustration of copper foils of the land 36 disposed on the front surface 31a and the rear surface 31b around the through hole 31c is omitted.

As shown in FIG. 2, the land 35 includes a copper foil 35a corresponding to a base, and a plating film 35b. The plating film 35b corresponds to a plating film including the pi-acceptor molecule 37, which will be described later.

The copper foil 35a includes copper as a constituent material. The copper foil 35a is formed by patterning a copper foil affixed on a surface of an insulation base 34.

The plating film 35b is disposed on a surface of the copper foil 35a. The plating film 35b covers the copper foil 35a. The plating film 35b defines a surface of the land 35. Specifically, the plating film 35b defines a surface of the land 35 that is to be soldered. The plating film 35b includes, as a main constituent, a metal that is capable of forming pi-backbonding (i.e., π-backbonding) with the pi-acceptor molecule 37 and capable of being formed into a film on the copper foil 35a. For example, the plating film 35b includes one of Ni, Cu, Ag or Co as the main constituent. Ni, Cu, Ag and Co are transition elements. Considering a solderability with the solder 33, Cu is preferable. In the present embodiment, the plating film 35b includes Cu as the constituent material. A thickness of the plating film 35b is in a range from 0.1 μm to 100 μm.

The plating film 35b further includes the pi-acceptor molecule 37 in addition to the metal as the main constituent (hereinafter, referred to as a main metal). A content of the pi-acceptor molecule 37 in the plating film 35b is equal to or greater than 0.1 weight percent (wt %), in terms of carbon atoms (C atoms), with respect to the main metal of the plating film 35b. The content of the pi-acceptor molecule 37 is calculated by converting the sum of the wt % of the main metal and the wt % of the pi-acceptor molecule 37 into 100 wt % while keeping a ratio of the wt % of the main metal and the wt % of the pi-acceptor molecule 37.

The content of the pi-acceptor molecule 37 in the plating film 35b is equal to or smaller than 50 volume percent (vol %) of the main metal of the plating film 35b. It is preferable that the content of the pi-acceptor molecule 37 in the plating film 35b is equal to or smaller than 15 wt %, in terms of C atoms, with respect to the main metal of the plating film 35b.

When the content of the pi-acceptor molecule 37 is greater than 50 vol %, there is a possibility that associations of metals in the plating film 35b are inhibited and conductive paths in the plating film 35b are disconnected. In this case, the plating film 35b shows high insulation property.

For example, when the main metal of the plating film 35b is copper and the pi-acceptor molecule 37 is 1,10-phenanthroline, and the content of the pi-acceptor molecule 37 is greater than 15 wt %, in terms of C atoms, with respect to the main metal of the plating film 35b, self-sustainability of the plating film 35b is inhibited and exfoliation of the plating film 35b is likely to occur. Accordingly, it is preferable that the content of the pi-acceptor molecule 37 in the plating film 35b is equal to or smaller than 15 wt %, in terms of C atoms, with respect to the main metal of the plating film 35b.

In the plating film 35b, the pi-acceptor molecule 37 is dispersed in the main metal of the plating film 35b. The plating film 35b is formed by adding and dissolving the pi-acceptor molecule 37 in a plating bath and conducting plating of the copper foil 35a in the plating bath. In FIG. 2, a solder resist is designed by a symbol 31d.

As shown in FIG. 3, the land 35 includes a plating film 36a corresponding to a base and a plating film 36b. The plating film 36b corresponds to the plating film including the pi-acceptor molecule 37. The plating film 36a includes copper as a constituent material. The plating film 36a is formed at the wall surface of the through hole 31c. The plating film 36a is formed around the opening of the through hole 31c. The plating film 36a is formed by an electroless copper plating.

The plating film 36b is disposed on a surface of the plating film 36a as the base. The plating film 36b covers the plating film 36a. The plating film 36b defines a surface of the land 36. Specifically, the plating film 36b defines a surface of the land 36 that is to be soldered. The plating film 36b includes, as a main constituent, a metal that is capable of forming pi-backbonding with the pi-acceptor molecule 37 and capable of being formed into a film on the plating film 36a. For example, the plating film 36b also includes one of Ni, Cu, Ag or Co as the main constituent. In the present embodiment, the plating film 36b includes Cu as the constituent material.

The plating film 36b further includes the pi-acceptor molecule 37 in addition to the metal as the main constituent. The content of the pi-acceptor molecule 37 in the plating film 36b is equal to or greater than 0.1 wt %, in terms of C atoms, with respect to the main metal of the plating film 36b. In the plating film 36b, the pi-acceptor molecule 37 is dispersed in the metal of the plating film 36b. The plating film 36b is formed by adding and dissolving the pi-acceptor molecule 37 in a plating bath and conducting plating of the plating film 36a in the plating bath.

The pi-acceptor molecule 37 is a molecule that has pi-acceptability and causes ligand field splitting equal to or greater than 2,2'-bipyridyl in spectrochemical series. The pi-acceptor molecule 37 has large pi-acceptability. The pi-acceptability may be referred to as pi-acidity. A degree of ligand field splitting corresponds to an energy difference between split d-orbitals. The pi-acceptor molecule 37 accepts electrons in an empty pi-orbital of the pi-acceptor molecule 37 and forms back-donation-pi-bonding (i.e., pi-backbonding) with a metal. Therefore, the pi-acceptor molecule 37 may be referred to as a pi-acceptor ligand. The pi-acceptor molecule 37 coordinates to the metal to form a metal complex. The pi-acceptability is proportionate to the degree of ligand field splitting. Hereinafter, well-known spectrochemical series will be described. In the following example, CO has the largest ligand field splitting.

py corresponds to pyridine, en corresponds to ethylene diamine, bpy corresponds to 2,2-bipyridyl, phen corresponds to 1,10-phenanthroline and PPh$_3$ corresponds to triphenylphosphine. Hereinafter, 2,2'-bipyridyl is expressed by bpy and 1,10-phenanthroline is expressed by phen.

For example, as the pi-acceptor molecule 37, bpy, bpy derivatives, phen and phen derivatives are employed. The pi-acceptor molecule 37 includes at least one of bpy and bpy derivatives. For example, the plating films 35b and 36b may include two kinds of bpy derivatives. Also, the plating films 35b and 36b may include bpy and bpy derivatives. Furthermore, the plating films 35b and 36b may include only bpy. Also, the pi-acceptor molecule 37 includes at least one of phen and phen derivatives. For example, the plating films 35b and 36b may include two kinds of phen derivatives. Also, the plating films 35b and 36b may include phen and phen derivatives. Furthermore, the plating films 35b and 36b may include only phen.

Each of bpy, bpy derivatives, phen and phen derivatives contains a nitrogen atom having lone pair of electrons. Each of bpy, bpy derivatives, phen and phen derivatives is a multidentate ligand containing two nitrogen atoms having lone pair. Each of bpy, bpy derivatives, phen and phen derivatives is a pi-conjugated ligand. Each of bpy, bpy derivatives, phen and phen derivatives is a heterocyclic compound. Each of bpy, bpy derivatives, phen and phen derivatives is a polycyclic compound containing multiple heterocyclic rings. The above exemplified pi-acceptor molecule 37 restricts the oxidation of the metal surface, which will be described in the following examples.

Figure 4:
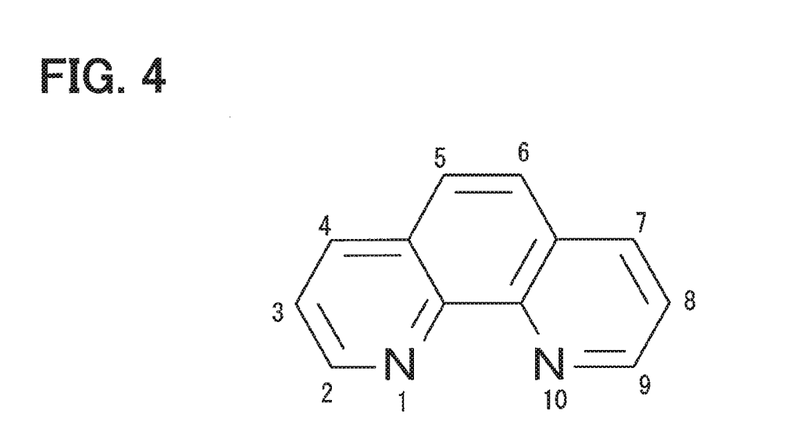
FIG. 4 is a diagram illustrating a molecular structure of a pi-acceptor molecule.
Figure 5:
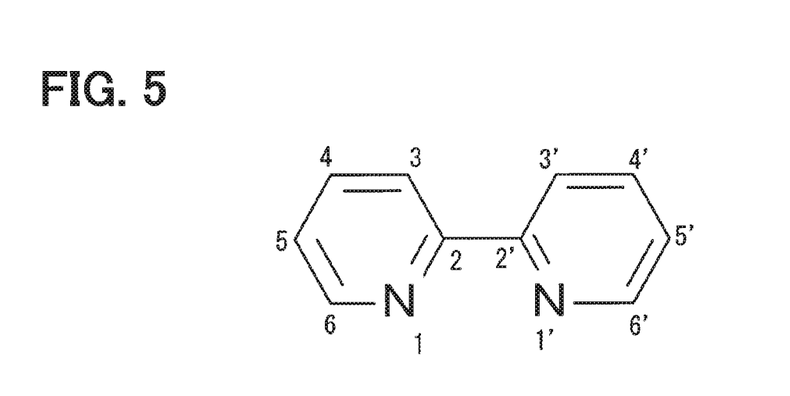
FIG. 5 is a diagram illustrating a molecular structure of the pi-acceptor molecule.

A molecular structure of phen is shown in FIG. 4 and a molecular structure of bpy is shown in FIG. 5. In FIG. 4 and FIG. 5, positional numbers are shown. In phen, hydrogen atoms are combined with carbon atoms at 2 to 9 positions.

phen derivatives include a molecule having similar structure to phen. For example, phen derivatives include a molecule containing other functional group, instead of hydrogen atom, combined with at least one of the carbon atoms at 2 to 9 positions. That is, phen derivatives correspond to phen whose hydrogen atom is substituted by other functional group. In bpy, hydrogen atoms are combined with carbon atoms at 3, 3', 4, 4', 5, 5', 6, and 6' positions. bpy derivatives include a molecule having similar structure to bpy. For example, bpy derivatives include a molecule containing other functional group, instead of hydrogen atom, combined with carbon atoms at 4, 4', 5, 5', 6 and 6' positions.

Figure 6:
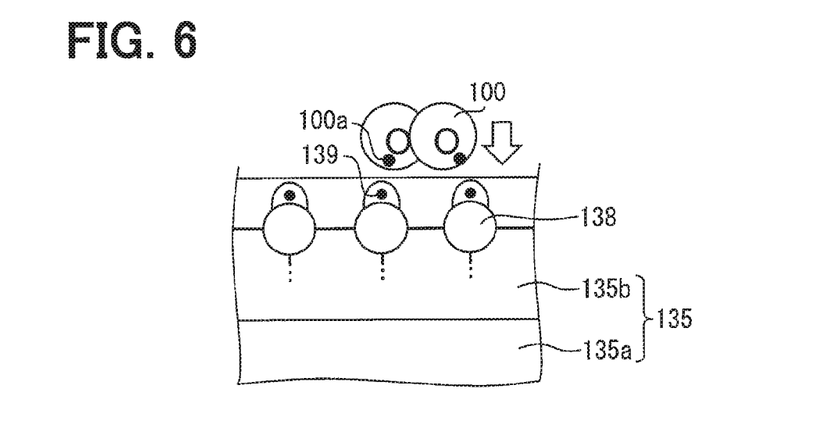
FIG. 6 is a diagram illustrating a reference example.
Figure 7:
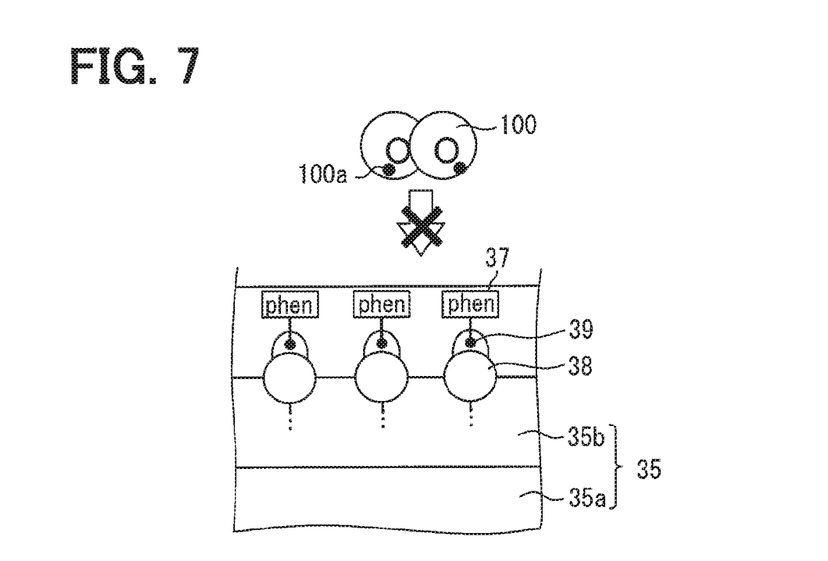
FIG. 7 is a diagram illustrating effects of the first embodiment.

Effects of the printed substrate 31 and the electronic device 10 according to the present embodiment will be described with reference to FIG. 6 and FIG. 7. FIG. 6 describes a reference example. In FIG. 6, elements of the reference example that are common or relative to the elements of the present embodiment will be designated by symbols adding 100 to the symbols of the present embodiment. In FIG. 6 and FIG. 7, metal atoms, dangling bonds, an oxygen molecule and unpaired electrons are schematically illustrated. Crystal structures of the metal atoms are not especially limited. In FIG. 7, the land 35 is illustrated as one example. The structure of FIG. 6 corresponds to FIG. 7.

In the reference example shown in FIG. 6, a land 135 includes a copper foil 135a and a plating film 135b. In this structure, a surface of the plating film 135b corresponds to a metal surface of the land 135. Electrons are localized at the surface of the plating film 135b like dangling bonds at a semiconductor surface. Hereinafter, the electrons localized at the metal surface are referred to as dangling bonds at the metal surface. As shown in FIG. 6, the metal atom 138 is located at the surface of the plating film 135b, and the metal atom 138 has a dangling bond 139.

As shown in FIG. 6, an oxygen molecule 100 has two unpaired electrons 100a. It is assumed that unpaired electrons 100a and the dangling bonds 139 are shared by the oxygen molecule 100 and the metal atom 138, and the oxygen molecule 100 is adsorbed to the metal surface to oxidize the metal surface. In other words, the localization of the electrons forms a surface level at the metal surface, and thus the oxygen molecule 100 having unpaired electron 100a is trapped by the surface level to oxidize the metal surface. Accordingly, in the reference example corresponding to a conventional structure, the surface of the land 135 is oxidized.

As shown in FIG. 7, in the present embodiment, the land 35 includes the copper foil 35a and the plating film 35b. Similarly to the reference example, the surface of the plating film 35b corresponds to the metal surface of the land 35. As described above, the plating film 35b includes the pi-acceptor molecule 37. In the example shown in FIG. 7, phen is dispersed as the pi-acceptor molecule 37.

As described above, the pi-acceptor molecule 37 accepts electrons in the empty pi-orbital of the pi-acceptor molecule 37 and forms pi-backbonding with a metal. The pi-acceptor molecule 37 is a molecule that has a large pi-acceptability and causes ligand field splitting equal to or greater than bpy in spectrochemical series. An energy level of the empty pi-orbital of the pi-acceptor molecule 37 is close to an energy level of an occupied d-orbital of the metal. Therefore, the pi-orbital and the d-orbital interact with each other and the electrons are delocalized from the metal to the pi-acceptor molecule 37. That is, the pi-acceptor molecule 37 forms pi-backbonding with the metal atom 38 (e.g., copper atom) of the plating film 35b. A coordinating atom of the pi-acceptor molecule 37 has lone pair of electrons. A sigma-orbital (i.e., σ-orbital) of the coordinating atom and the empty orbital of the metal (e.g., d-orbital) interact with each other to form a sigma-bond (σ bond).

Accordingly, in the present embodiment, the pi-acceptor molecule 37 forms pi-backbonding with the metal atom 38 having the dangling bond 39. The content of the pi-acceptor molecule 37 in the plating film 35b is equal to or greater than 0.1 wt %, in terms of C atoms, with respect to the main metal of the plating film 35b and sufficient content of the pi-acceptor molecule 37 is dispersed and provided around the metal surface of the plating film 35b. In the land 35 that is to be soldered, the dangling bonds at the metal surface are reduced or removed. As a result, the oxidation of the land 35 is restricted without employing the pre-flux.

As described above, the pre-flux tends to have short life-span. When the printed substrate to which the pre-flux is applied is stored in air, the pre-flux is depleted in a short span. In this case, soldering failure is likely to occur in forming an electronic device by soldering the printed substrate. On the other hand, in the present embodiment, the pi-acceptor molecule 37 is combined with the metal atom 38 having the dangling bond 39 and restricts the oxidation of the metal surface. In the present embodiment, the oxidation is restricted as far as the bond between the pi-acceptor molecule 37 and the metal atom 38 is sustained. As described above, the pi-acceptor molecule 37 coordinates to the metal atom 38 via pi-backbonding in addition to sigma-bonding. Therefore, the oxidation of the land 35 is restricted for a long period of time according to the present embodiment. For example, the oxidation of the land 35 is restricted for a long period of time even though the printed substrate 31 and the electronic device are stored in air.

Since the present embodiment does not employ a noble metal such as gold, the oxidation of the metal surface is restricted cheaply.

Since the land 36 has the plating film 36b including the pi-acceptor molecule 37, similar effects to the land 35 are achieved.

For example, it is preferable to employ phen derivative in which the electron withdrawing group is combined with at least one of the atoms of phen at 2 to 9 positions as the pi-acceptor molecule 37. When the hydrogen atom is substituted by the electron withdrawing group, the pi-acceptability is increased due to the electron withdrawing characteristics. Namely, the dangling bonds of the metal are withdrawn by phen. As such, bond strength is increased. That is, heat resistance is increased and the printed substrate 31 and the electronic device 10 may be employed in broader temperature range. For example, the electron withdrawing group includes nitro group, aldehyde group, carboxy group and cyano group. Similarly, bpy increases heat resistance. Specifically, it is preferable to employ bpy derivative in which the electron withdrawing group is combined with at least one of the atoms of bpy at 3 to 6 and 3' to 6' positions. As a result, the pi-acceptability is increased and the heat resistance is increased.

Next, specific examples will be described.

EXAMPLE

Figure 8:
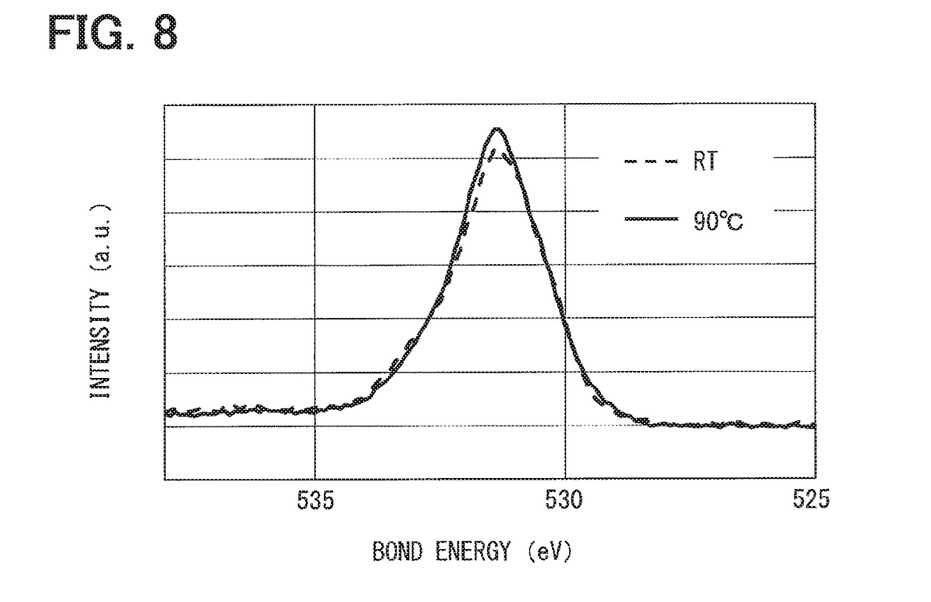
FIG. 8 is a diagram illustrating measurement results of XPS in an example.

A relationship between the presence of the pi-acceptor molecule 37 and the oxidation of the metal surface is examined. First, a base including phosphor bronze and having a flat plate shape is prepared. A size of the base is 20 millimeters×20 millimeters. phen of the pi-acceptor molecule 37 and an additive reagent are added and stirred in a plating bath mainly including copper. The plating film is formed at the surface of the base in the plating bath to make a test piece. The content of the pi-acceptor molecule 37 in the plating film is equal to or greater than 0.1 wt %, in terms of C atoms, with respect to copper (e.g., 0.5 to 9 wt %). The test piece is analyzed by X-ray photoelectron spectroscopy (XPS) at room temperature (e.g., 25 degrees Celsius). The test piece is heated on a hot plate and a temperature of the test piece is kept at 90 degrees Celsius for 3 hours. The test piece after 3 hours of heating is analyzed by XPS. The results are shown in FIG. 8. In FIG. 8, a broken line indicates a result at room temperature, and a solid line indicates a result at 90 degrees Celsius. The above experiment is conducted in air.

Figure 9:
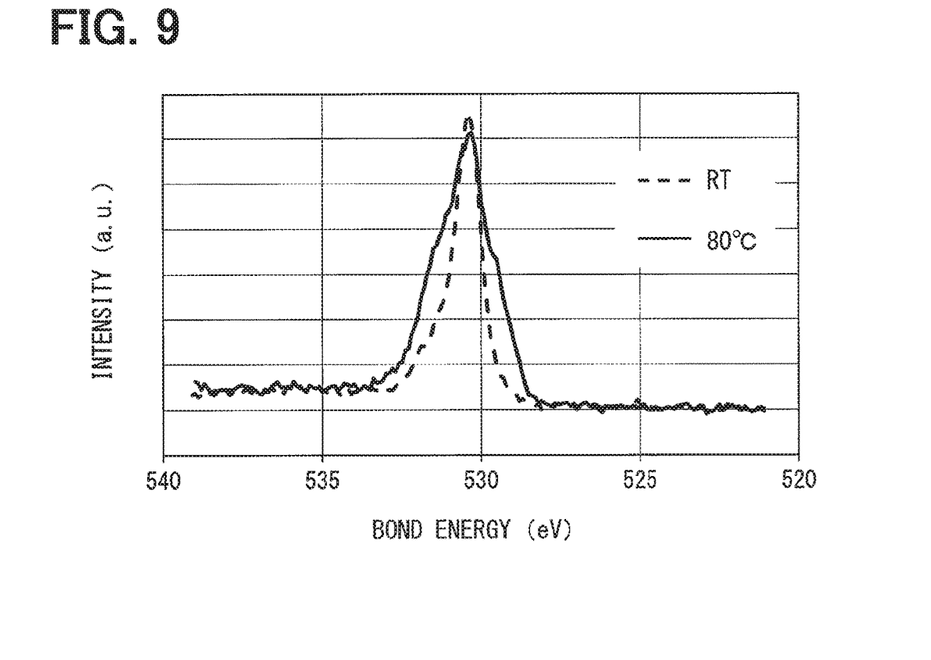
FIG. 9 is a diagram illustrating measurement results of XPS in a comparative example.

As a comparative example, a test piece that does not include the pi-acceptor molecule 37 (i.e., phen) in the plating film is made. The test piece of the comparative example is analyzed by XPS at room temperature and 80 degrees Celsius. The results are shown in FIG. 9. In FIG. 9, a broken line indicates a result at room temperature, and a solid line indicates a result at 80 degrees Celsius.

Copper II oxide (CuO) exhibits a peak at 529.5 eV, and copper I oxide (Cu2O) exhibits a peak at 530.4 eV. In the example, as shown in FIG. 8, an intensity of the peak at 529.5 eV is almost the same at room temperature and at 90 degrees Celsius. Also, an intensity of the peak at 530.5 eV is almost the same at room temperature and at 90 degrees Celsius. Therefore, in the example, the oxidation of the metal surface is restricted.

On the other hand, in the comparative example, even though the test piece is heated at 80 degrees Celsius, which is lower than the example, as shown in FIG. 9, a square measure of a band having a peak at 529.5 eV is increased at room temperature. At 80 degrees Celsius, shoulders are observed in the perk at 530.5 eV. Therefore, in the comparative example, in which the plating film does not include the pi-acceptor molecule 37, the oxidation of the metal surface is proceeded. The similar results are obtained with bpy.

Accordingly, specific content of the pi-acceptor molecule 37 restricts the oxidation of the land 35. Especially, it is preferable to employ at least one of phen and phen derivatives as the pi-acceptor molecule 37.

(Second Embodiment)

Second embodiment may refer to the first embodiment. Portions of the second embodiment that are common to the printed substrate 31 and the electronic device 10 of the first embodiment will not be repeatedly described.

Figure 10:
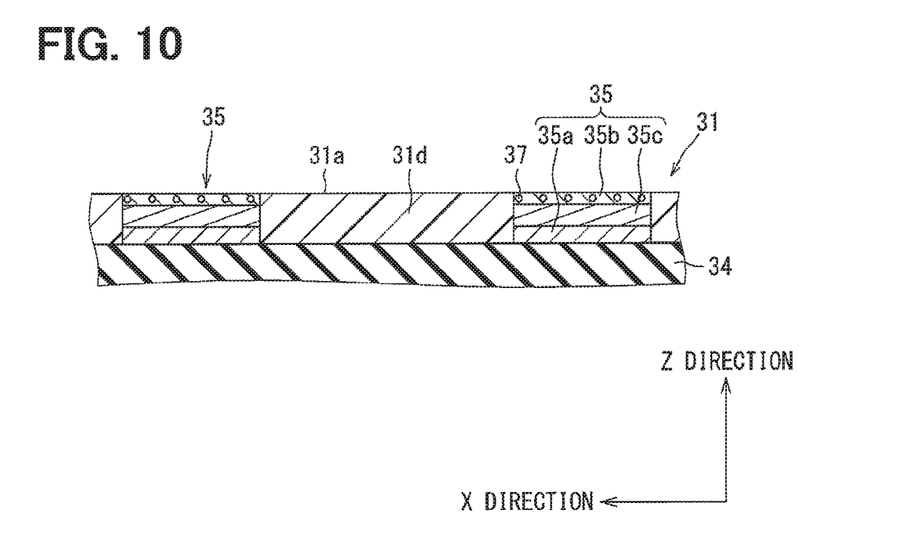
FIG. 10 is a cross-sectional view, corresponding to FIG. 2, illustrating a circumference of a land of the printed substrate on which an electronic component is mounted, according to a second embodiment.

In the present embodiment, as shown in FIG. 10, the land 35 includes multiple layers of plating films that are disposed on the copper foil 35a as the base. The multiple layers of the plating films include the above described plating film 35b and a plating film 35c. The plating film 35c is a plating film that does not include the pi-acceptor molecule 37, and is formed on the copper foil 35a. In the present embodiment, the plating film 35c includes copper as the main constituent. The plating film 35b is disposed on the plating film 35c. As described above, the plating film 35b includes the pi-acceptor molecule 37 and defines the surface of the land 35. The content of the pi-acceptor molecule 37 in the plating film 35b is equal to or greater than 0.1 wt %, in terms of C atoms, with respect to the main metal of the plating film 35b.

In the present embodiment, an outermost layer of the multiple layers of plating films corresponds to the plating film 35b including the pi-acceptor molecule 37 and defining the surface of the land 35. The plating film 35b restricts the oxidation of the land 35. The plating film 35c of the plating films 35b and 35c disposed on the copper foil 35a of the base does not include the pi-acceptor molecule 37. Therefore, a conductivity of the plating film 35c is higher than a conductivity of the plating film 35b including the pi-acceptor molecule 37. Compared to a structure having only plating film 35b on the copper foil 35a, decrease of the conductivity is restricted while restricting the oxidation of the land 35.

In the case of employing phen as the pi-acceptor molecule 37, when an atomic percent (atm %) of a carbon atom (C) of phen in the plating film 35b is 2 to 3%, the conductivity of the plating film 35b is around one-tenth of pure copper having $5.9 \times 10^7$ s/m of conductivity.

The multi-layer structure of the plating films is not limited to the above examples. The plating films may include 3 layers of plating films. In this case, only the plating film 35b at the outermost layer includes the pi-acceptor molecule 37.

The above described structure is not limited to the land 35, and may be adopted to the land 36. In the case of the land 36, only the plating film 36b at the outermost layer of the multiple layers of plating films disposed on the plating film 36a as the base includes the pi-acceptor molecule 37.

(Other Embodiments)

Although the copper foil 35a is described as an example of the base of the land 35, the present disclosure is not limited to the example. A material other than the copper foil may be employed. A metal other than copper may be employed as the lands 35 and 36.

The lands 35 and 36 at least include the plating films 35b and 36b defining the surfaces of the lands 35 and 36.

The objects to which the lands 35 are connected are not limited to the electronic components 32. For example, the lands 35 may be connected to the connector 40 having a surface-mount-structure. The objects to which the lands 36 are connected are not limited to the terminals 42 of the connector 40. For example, the lands 36 may be connected to the electronic components 32 having a surface-mount-structure.

The electronic device 10 is not limited to the above described examples. The above embodiments may be adopted to the land to be soldered as far as the electronic device includes the electrical component and the printed substrate having the land that is electrically connected to the electrical component through the solder.

Although an example is described in which the printed substrate 31 includes the lands 35 and 36, the printed substrate 31 may include only one of the lands 35 and 36.

While only the selected exemplary embodiment and examples have been chosen to illustrate the present disclosure, it will be apparent to those skilled in the art from this disclosure that various changes and modifications can be made therein without departing from the scope of the disclosure as defined in the appended claims. Furthermore, the foregoing description of the exemplary embodiment and examples according to the present disclosure is provided for illustration only, and not for the purpose of limiting the disclosure as defined by the appended claims and their equivalents.

What is claimed is:

1. A printed substrate comprising:
   a land that is to be soldered, wherein
   the land includes a plating film that defines a surface of the land,
   the plating film includes a metal as a main constituent and a pi-acceptor molecule that is dispersed in the plating film,
   the pi-acceptor molecule has pi-acceptability and causes ligand field splitting equal to or greater than that of 2, 2'-bipyridyl in spectrochemical series, a content of the pi-acceptor molecule in the plating film is equal to or greater than 0.1 weight percent, in terms of carbon atoms, with respect to the metal of the plating film, and the metal and the pi-acceptor molecule form pi-backbonding in the plating film.

2. The printed substrate according to claim 1, wherein the pi-acceptor molecule includes at least one of 1, 10-phenanthroline and 1, 10-phenanthroline derivative.

3. The printed substrate according to claim 1, wherein the pi-acceptor molecule includes at least one of 2, 2'-bipyridyl and , 2'-bipyridyl derivative.

4. The printed substrate according to claim 1, wherein the land includes multiple layers of plating films including the plating film, and an outermost layer of the multiple layers of plating films defines the surface of the land and includes the pi-acceptor molecule.

5. An electronic device comprising:

an electrical component; and a printed substrate, wherein the printed substrate includes a land that is electrically connected to the electrical component through a solder, the land includes a plating film that defines a surface of the land, the plating film includes a metal as a main constituent and a pi-acceptor molecule that is dispersed in the plating film, the pi-acceptor molecule has pi-acceptability and causes ligand field splitting equal to or greater than that of 2, 2'-bipyridyl in spectrochemical series, a content of the pi-acceptor molecule in the plating film is equal to or greater than 0.1 weight percent, in terms of carbon atoms, with respect to the metal of the plating film, and the metal and the pi-acceptor molecule form pi-backbonding in the plating film.

6. The printed substrate according to claim 1, wherein the metal is a d-block transition metal.

7. The printed substrate according to claim 1, wherein the pi-backbonding in the plating film is between a d-orbital of the metal and a pi-orbital of the pi-acceptor molecule.

8. The printed substrate according to claim 6, wherein the pi-backbonding in the plating film is located between a d-orbital of the d-block transition metal and a pi-orbital of the pi-acceptor molecule.

9. The printed substrate according to claim 1, wherein the metal is one or more metals selected from the group consisting of nickel, copper, gold, and cobalt.

10. The electronic device according to claim 5, wherein the metal is a d-block transition metal.

11. The electronic device according to claim 5, wherein the pi-backbonding in the plating film is between a d-orbital of the metal and a pi-orbital of the pi-acceptor molecule.

12. The electronic device according to claim 10, wherein the pi-backbonding in the plating film is between a d-orbital of the d-block transition metal and a pi-orbital of the pi-acceptor molecule.

13. The electronic device according to claim 5, wherein the metal is one or more metals selected from the group consisting of nickel, copper, gold, and cobalt.

* * * * *